US009362946B2

(12) United States Patent
Cox et al.

(10) Patent No.: US 9,362,946 B2
(45) Date of Patent: Jun. 7, 2016

(54) DETERMINATION OF ENCODING BASED ON PERCEIVED CODE POINT CLASSES

(71) Applicant: International Business Machines Corporation, Armonk, NY (US)

(72) Inventors: Benjamin D. Cox, Winchester (GB); Stewart O. M. Francis, Winchester (GB)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/534,392

(22) Filed: Nov. 6, 2014

(65) Prior Publication Data

US 2016/0134303 A1    May 12, 2016

(51) Int. Cl.
| | |
|---|---|
| H03M 7/00 | (2006.01) |
| H04L 29/06 | (2006.01) |
| H03M 7/30 | (2006.01) |
| H04L 29/08 | (2006.01) |
| H04N 19/61 | (2014.01) |

(52) U.S. Cl.
CPC . *H03M 7/00* (2013.01); *H03M 7/30* (2013.01); *H04L 29/0604* (2013.01); *H04L 29/08072* (2013.01); *H04N 7/50* (2013.01)

(58) Field of Classification Search
CPC ............... H03M 7/30; H04L 29/08072; H04L 29/0604; H04N 7/50
USPC .................. 341/50; 375/240.25; 709/201, 247
See application file for complete search history.

(56) References Cited

U.S. PATENT DOCUMENTS

| | | | |
|---|---|---|---|
| 7,251,667 B2 | 7/2007 | Atkin | |
| 7,886,309 B2 | 2/2011 | Atkin et al. | |
| 7,982,637 B2 | 7/2011 | Joyce | |
| 8,719,326 B2 * | 5/2014 | Richard | H04L 9/3247 709/201 |
| 8,751,522 B2 | 6/2014 | Liu et al. | |
| 2012/0254181 A1 | 10/2012 | Schofield et al. | |

OTHER PUBLICATIONS

U.S. Appl. No. 14/702,897 entitled "Determination of Encoding Based on Perceived Code Point Classes" filed May 4, 2015.
Appendix P List of IBM Patents or Patent Applications Treated as Related.
"Automatic code page detection"; Printed: Sep. 29, 2014; <http://publib.boulder.ibm.com/inforcenter/discover/v8r5m0/topic/co . . . >.
"Character Encoding in the .NET Framework"; Developer Network; <http://msdn.microsoft.com/en-us/library/ms404377(v=vs.110). aspx>.
"The Content—Transfer-Encoding Header Field"; Printed: Sep. 29, 2014; <http://www.w3org/Protocols/rfc1341/5_Content-Transfer-Encoding . . . >.

* cited by examiner

*Primary Examiner* — Joseph Lauture
(74) *Attorney, Agent, or Firm* — Edward P. Li

(57) ABSTRACT

A method, a computer program product, and a computer system for determination of encoding based on received code point classes are provided. The computer implemented method includes transferring data in a text form. The computer implemented method includes, in response to determining that decoding the data in text form passes, transferring some or all of the data in a binary form. The computer implemented method includes calculating code point class proportions for the data in the text form and the data in the binary form and determining a best form for transferring the data, based on comparison of the code point class proportions.

4 Claims, 2 Drawing Sheets

DETERMINATION OF ENCODING BASED ON PERCEIVED CODE POINT CLASSES

TECHNICAL FIELD OF THE INVENTION

The present invention relates generally to data encoding, and more particularly to determination of encoding based on received code point classes.

BACKGROUND

Text data can be stored in many different encodings. These may differ due to locale, for example English versus Turkish, due to the default settings for a particular architecture, for example ASCII for a Windows system versus an EBCDIC (Extended Binary Coded Decimal Interchange Code) variant for a mainframe, or due to particular decisions about how to store it. For transferring the data from a host system to a client system by a method such as the FTP protocol, a choice is either transferring the data in a binary form or in a text form. In the binary form, the data is left unmodified during the transfer. In the text form, the host makes some assumptions about the initial encoding of the data, based on file metadata or content, the host's default settings or some other information, and the encoding of the client, and the host converts the data from that initial encoding to the client encoding. However, many of these assumptions can be wrong; for example, a mainframe may assume that a file is encoded as IBM-037 (an EBCDIC code), even through it is actually ASCII. With the wrong assumption, the encoding conversion will result in garbage being transferred, and consequently the client is unable to read it. Therefore, the choice between transferring as binary or text is an important one, and the choice can lead to manual trial-and-error in order to transfer correctly.

One way to reduce the manual effort may be as follows. Step 1: transfer as text and then have the client attempt to use a decoder to decode the transferred data. If the decoding passes, then use that data and leave the algorithm at this point. But, the decoding can often result in the decoding process giving errors and the data does not map into recognized characters; this is an indication that the transfer is incorrect. Step 2: if transferring as text is incorrect, fall back to transferring as binary and use binary data. However, this method can fail when using some decoders. For example, the decoders of some operating systems and some encodings are weaker at validating than in others, so that sometimes decoding at step 1 succeeds although the data has not been transferred in the correct mode.

SUMMARY

In one aspect, a method for determination of encoding based on received code point classes is provided. The method comprises: transferring data in a text form; in response to determining that decoding the data in text form passes, transferring some or all of the data in a binary form; calculating code point class proportions for the data in the text form and the data in the binary form; and determining a best form for transferring the data, based on comparison of the code point class proportions.

In another aspect, a computer program product for determination of encoding based on received code point classes is provided. The computer program product comprises a computer readable storage medium having program code embodied therewith, the program code executable to: transfer data in a text form; in response to determining that decoding the data in text form passes, transfer some or all of the data in a binary form; calculate code point class proportions for the data in the text form and the data in the binary form; and determine a best form for transferring the data, based on comparison of the code point class proportions.

In yet another aspect, a computer system for determination of encoding based on received code point classes is provided. The computer system comprises one or more processors, one or more computer readable tangible storage devices, and program instructions stored on at least one of the one or more computer readable tangible storage devices for execution by at least one of the one or more processors. The program instructions are executable to transfer data in a text form. The program instructions are executable to transfer some or all of the data in a binary form, in response to determining that decoding the data in text form passes. The program instructions are executable to calculate code point class proportions for the data in the text form and the data in the binary form. The program instructions are executable to determine a best form for transferring the data, based on comparison of the code point class proportions.

DETAILED DESCRIPTION

Figure 1:
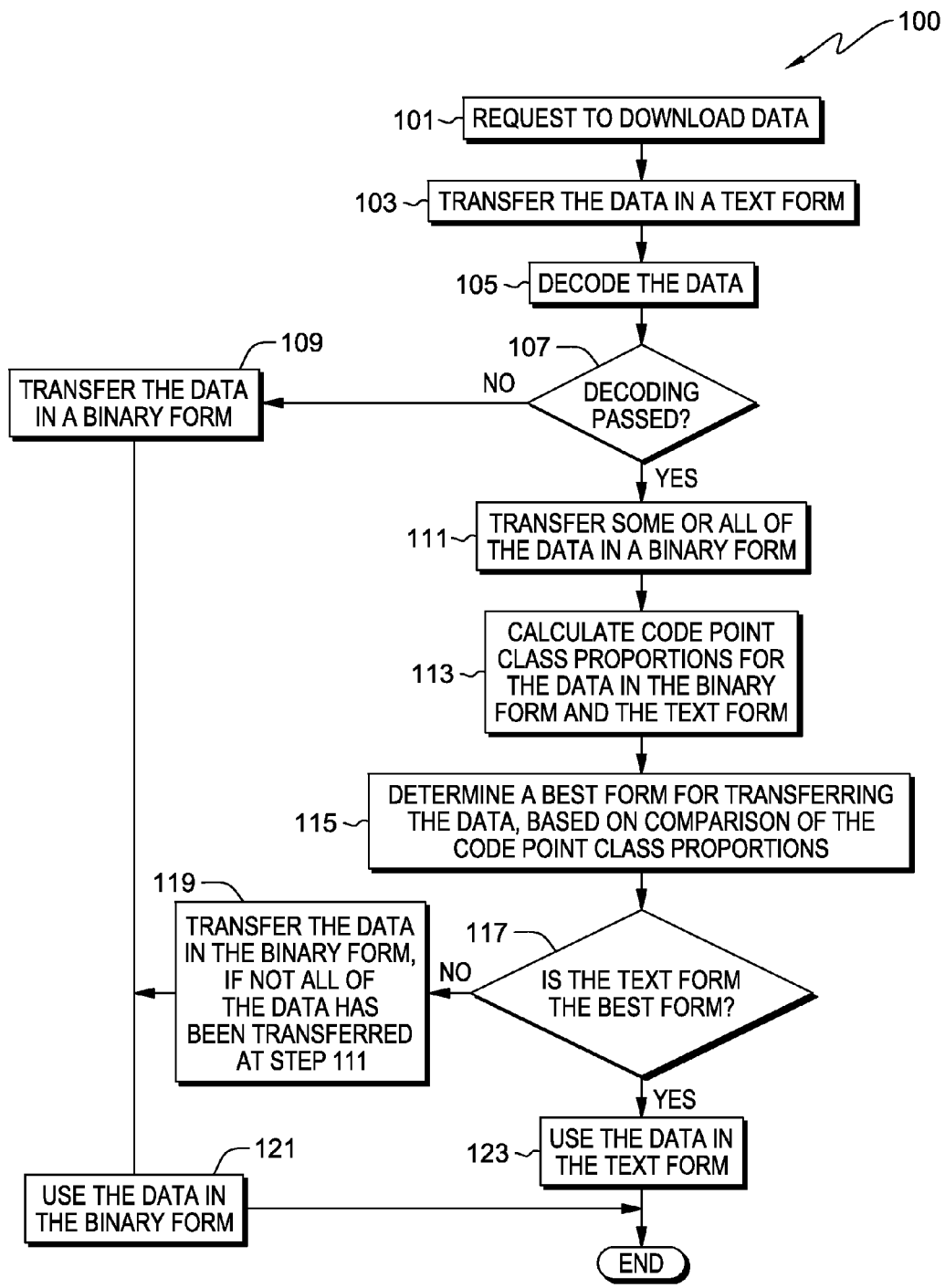
FIG. 1 is a flowchart showing operational steps for determination of encoding based on received code point classes, in accordance with one embodiment of the present invention.

Embodiments of the present invention allow for better confidence in the data that has been transferred, improving the algorithm in order to compensate for the weaker and less validating decoders. Embodiments of the present invention classify each character of the decoded data by its code point class, and then decide whether the data is more correctly decoded with one transfer method than with another transfer method. This increases the proportion of times in which the correct transfer method can be correctly guessed, without having to resort to manually stating which transfer method should take place.

The value of each character in a string, known as its code point, can be classified into one or more classes. For example, some of the most commonly understood classes may be alphabetic, numerical, and uppercase classes. However, there are also other classes that represent other things, such as ISO control characters which include whitespace, bell, and escape among others. Embodiments of the present invention make use of the way in which the percentage of characters coming from different code point classes differs between text files that have been correctly transferred and those that have been incorrectly transferred.

Embodiments of the present invention include, in the case where the text transfer and decoding has been successful, additional steps: transferring a certain amount of the data using a binary transfer, and analyzing the character classes of the binary-transferred section against the character classes of the same section from the text-transferred data. The certain amount of the data, depending on implementation, may be the whole stream or just a portion of the date which is enough to produce a meaningful sample size. The proportions of characters that are in each character class will differ between data provided by the binary transfer method and the text transfer method, depending on which one is the correct transfer method. The results of the comparisons of the different character class proportions can be combined in an implementation-specific manner to decide which transfer type is correct.

Once the perceived correct transfer type has been calculated, the data transferred in that encoding can then be used. If only a sample of the binary data was transferred in order to do the comparison, this may involve transferring the rest of the binary data. The data can now be presented to the user or otherwise used, with greater confidence that it is correctly encoded.

The example presented in Table 1 shows comparison between the code point class proportions for some data which has been transferred via both text and binary transfer. As shown in the example in Table 1, the higher proportion of alphanumeric characters couples with the low proportion of control characters in the binary transfer, whereas the text transfer shows the opposite trend. This will likely indicate that the binary transfer type was the correct transfer type. Embodiments of the present invention do not specify which algorithm to use to combine this data, as this may depend on the code pages that are being transferred and other factors. However, as an example, a simple algorithm for turning this data into a decision may take the proportion of alphanumeric characters, multiply by the proportion of non-control characters, and decide which transfer mode has the highest score. One with the highest score will be the transfer mode chosen. In the example of Table 1, the score calculation for the text is 23.46%*(100%-29.63%)=16.51%, while the score calculation for the binary is 56.00%*(100%-2.46%)=54.62%. The binary transfer code has a much higher score in this example. Other algorithms may add variations such as weighting the alphanumeric proportion more heavily than the non-control character proportion, since control characters such as carriage returns and new lines are legitimate text characters.

TABLE 1

| Transfer Mode | Code Point Class proportion | | | | |
|---|---|---|---|---|---|
| | Alphabetic | Bmp Code Point | Defined | Digit | High Surrogate |
| Text | 23.46% | 100% | 100% | 0.00% | 0.00% |
| Binary | 49.43% | 100% | 100% | 6.56% | 0.00% |

| Transfer Mode | Code Point Class proportion | | | | |
|---|---|---|---|---|---|
| | Identifier Ignorable | Ideographic | ISO Control | Letter | Letter or Digit |
| Text | 29.63% | 0.00% | 29.63% | 23.46% | 23.46% |
| Binary | 0.00% | 0.00% | 2.56% | 49.43% | 56.00% |

Embodiments of the present invention are now described in detail with reference to the accompanying FIGs.

FIG. 1 is flowchart 100 showing operational steps for determination of encoding based on received code point classes, in accordance with one embodiment of the present invention. The operational steps are implemented by a computer system hosted by computer device 200 shown in FIG. 2. At step 101, the computer system requests to download data. At step 103, the computer system transfers the data in a text form. At step 105, the computer system decodes the data. At decision block 107, the computer system determines whether decoding passes. In response to determining that the decoding does not pass (NO branch of decision block 107), the computer system at step 109 transfers the data in a binary form. Then, at step 121, computer system uses the data in the binary form. Steps 101, 103, 105, 107, 109, and 121 are steps of a method without the present invention.

In the embodiment of the present invention, in response to determining that the decoding passes (YES branch of decision block 107), the computer system at step 111 transfers some or all of the data in a binary form. A certain amount of the data is transferred using a binary transfer; the certain amount of the data, may be the whole stream or just a portion of the date which is enough to produce a meaningful sample size.

At step 113, the computer system calculates code point class proportions for the data in the binary form and the text form. In an example of Table 1 (presented in previous paragraphs) shows comparison between the code point class proportions for some data which has been transferred via both text and binary transfer.

At step 115, the computer system determines a best form for transferring the data, based on comparison of the code point class proportions which are calculated at step 113. The proportions of characters will differ between data provided by the binary transfer method and the text transfer method, depending on which one is the correct transfer method. The computer system analyzes the character classes of the binary-transferred section against the character classes of the same section from the text-transferred data, and then makes the decision on the best form.

At decision block 117, the computer system determines whether the text form is the best form for transferring the data. In response to determining that the text form is the best form (YES branch of decision block 117), at step 123, the computer system uses the data in the text form. In response to determining that the text form is not the best form (NO branch of decision block 117), at step 119, the computer system transfers the data in the binary form, if not all the data has been transferred at step 111. Then, at step 121, the computer system uses the data in the binary form.

Figure 2:
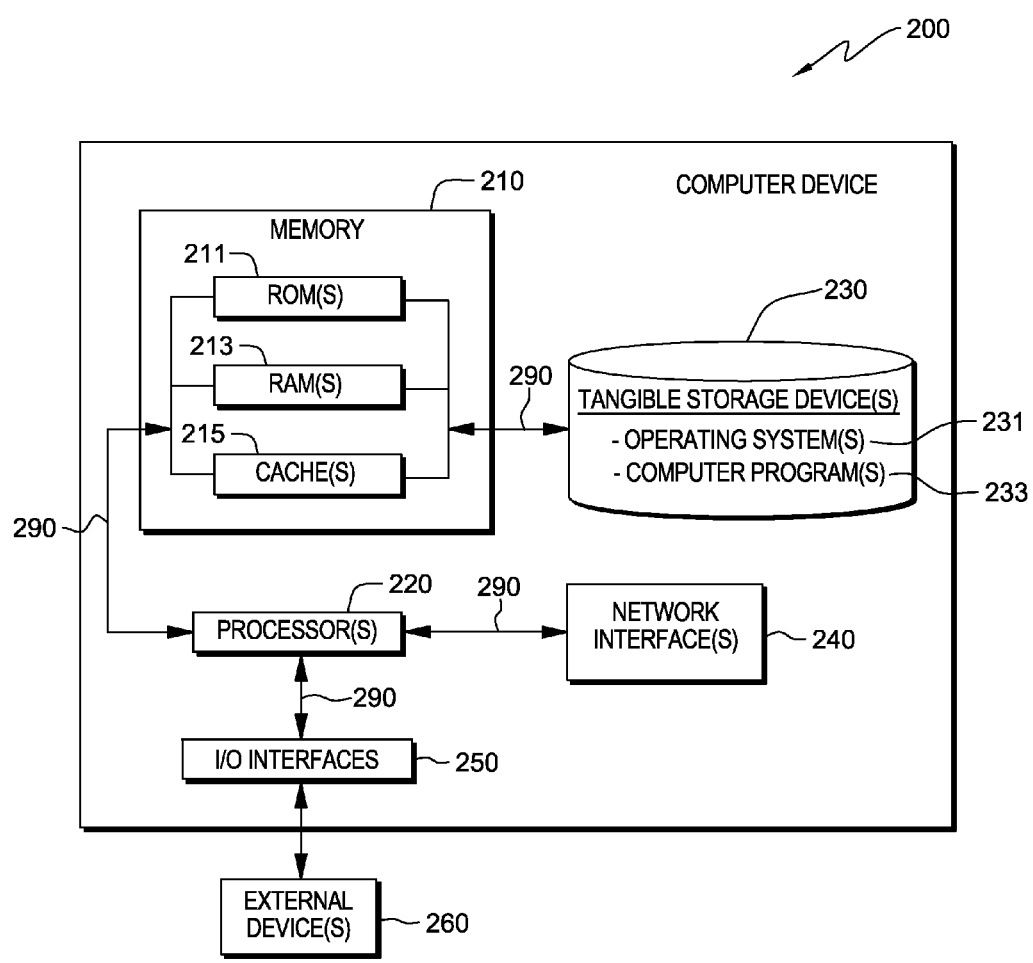
FIG. 2 is a diagram illustrating components of a computer device hosting one or more computing programs for determination of encoding based on received code point classes, in accordance with one embodiment of the present invention.

FIG. 2 is a diagram illustrating components of a computer device hosting one or more computing programs for determination of encoding based on received code point classes, in accordance with one embodiment of the present invention. It should be appreciated that FIG. 2 provides only an illustration of one implementation and does not imply any limitations with regard to the environment in which different embodiments may be implemented.

Referring to FIG. 2, computer device 200 includes processor(s) 220, memory 210, tangible storage device(s) 230, network interface(s) 240, and I/O (input/output) interface(s) 250. In FIG. 2, communications among the above-mentioned components of computing device 200 are denoted by numeral 290. Memory 210 includes ROM(s) (Read Only Memory) 211, RAM(s) (Random Access Memory) 213, and cache(s) 215. One or more operating systems 231 and one or more computer programs 233 reside on one or more computer readable tangible storage device(s) 230. One or more computing programs for determination of encoding based on received code point classes reside on one or more computer readable tangible storage device(s) 230. Computing device 200 further includes I/O interface(s) 250. I/O interface(s) 250 allows for input and output of data with external device(s) 260 that may be connected to computing device 200. Computing device 200 further includes network interface(s) 240 for communications between computing device 200 and a computer network.

The present invention may be a system, a method, and/or a computer program product. The computer program product may include a computer readable storage medium (or media)

having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device, such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network (LAN), a wide area network (WAN), and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++, and conventional procedural programming languages, such as the "C" programming language, or similar programming languages. The computer readable program instructions may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture, including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus, or other device to produce a computer implemented process, such that the instructions which execute on the computer, other programmable apparatus, or other device implement the functions/acts specified in the flowchart and/or block diagram block or blocks.

The flowchart and block diagrams in the FIGs illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the FIGs. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method for determination of encoding based on received code point classes, the method comprising:
    transferring data in a text form;
    in response to determining that decoding the data in the text form is successful, transferring some or all of the data in a binary form;
    calculating code point class proportions for the data in the text form and the data in the binary form; and
    determining a best form for transferring the data, based on comparison of the code point class proportions, wherein the best form is chosen from the binary form and the text form, wherein the best form encodes the data correctly with greater confidence.

2. The method of claim 1, further comprising:

in response to determining that the text form is the best form, using the data in the text form.

3. The method of claim 1, further comprising:

in response to determining that the text form is not the best form, transferring the data in the binary form; and using the data in the binary form.

4. The method of claim 1, further comprising:

in response to determining that decoding the data in text form is not successful, transferring the data in the binary form; and using the data in the binary form.

\* \* \* \* \*